(12) United States Patent
He et al.

(10) Patent No.: US 11,380,376 B2
(45) Date of Patent: Jul. 5, 2022

(54) APPARATUSES AND METHODS TO PERFORM LOW LATENCY ACCESS OF A MEMORY

(71) Applicant: Micron Technology, Inc., Boise, ID (US)

(72) Inventors: Yuan He, Boise, ID (US); Daigo Toyama, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/003,913

(22) Filed: Aug. 26, 2020

(65) Prior Publication Data

US 2022/0068329 A1    Mar. 3, 2022

(51) Int. Cl.
*G11C 8/00* (2006.01)
*G11C 7/22* (2006.01)
*G11C 7/10* (2006.01)

(52) U.S. Cl.
CPC ............ *G11C 7/222* (2013.01); *G11C 7/1039* (2013.01); *G11C 7/1045* (2013.01); *G11C 7/1096* (2013.01)

(58) Field of Classification Search
CPC ...................................................... G11C 7/222
USPC ........................................................ 365/233.1
See application file for complete search history.

(56) References Cited

U.S. PATENT DOCUMENTS 6,397,299 B1 *   5/2002   Meyer ..................... G06F 12/06
                                                              711/138

* cited by examiner

*Primary Examiner* — Hoai V Ho
(74) *Attorney, Agent, or Firm* — Dorsey & Whitney LLP

(57) ABSTRACT

An exemplary memory is configurable to operate in a low latency mode through use of a low latency register circuit to execute a read or write command, rather performing a memory array access to execute the read or write command. A control circuit determines whether an access command should be performed using the low latency mode of operation (e.g., first mode of operation) or a normal mode of operation (e.g., second mode of operation). In some examples, a processor unit directs the memory to execute an access command using the low latency mode of operation via one or more bits (e.g., a low latency enable bit) included in the command and address information.

23 Claims, 5 Drawing Sheets

APPARATUSES AND METHODS TO PERFORM LOW LATENCY ACCESS OF A MEMORY

BACKGROUND OF THE INVENTION

In some examples, certain applications may include iterative, data intensive algorithms that continuously generating new data based on previously-generated data. In such applications, system latency related to repeatedly storing and retrieving recently generated data can significantly affect performance of the new data and/or retrieving previously stored data may significantly impact performance of the application. Thus, reducing data storage and retrieval latency is desired to improve performance of such applications.

DETAILED DESCRIPTION

Figure 1:
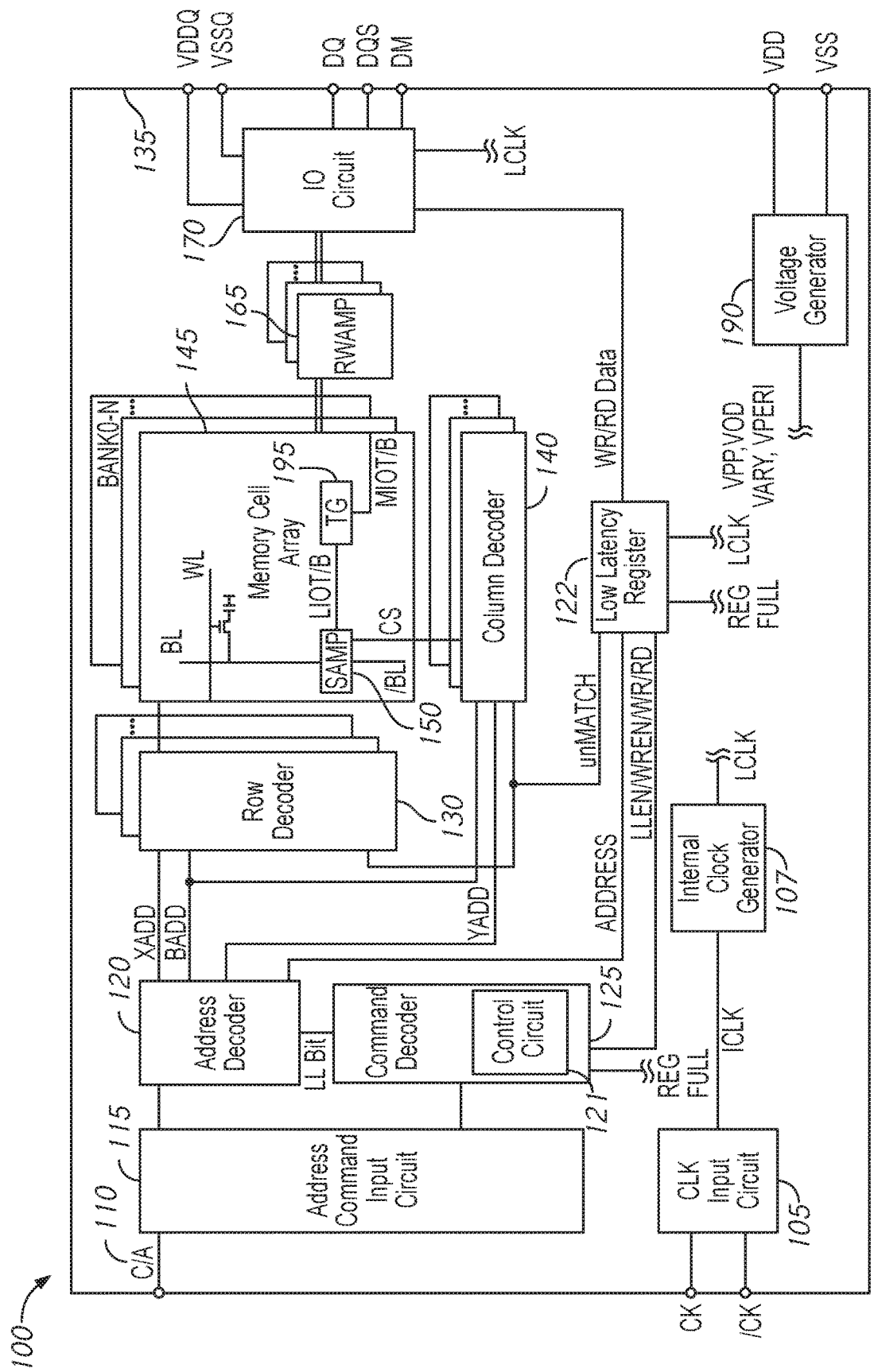
FIG. 1 is a schematic block diagram of a semiconductor device 100, in accordance with an embodiment of the present disclosure.

This disclosure describes examples of a memory that is configurable to operate in a low latency mode through use of a low latency register circuit to execute a read or write command, rather performing a memory array access to execute the read or write command. The low latency mode of operation may be configured to support full speed calculations of certain types of applications, such as artificial intelligence (AI) or machine learning (ML) applications. The calculations perforated by these applications may be iterative, data-intensive calculations that require frequent access to newly generated data. The low latency register circuit may include registers that are capable of storing a limited subset of address and data information. Thus, to support some applications, rather than writing certain data to the memory array, a control circuit of the memory may be configured to cause data to be read from or written to the low latency register circuit.

A control circuit may determine whether an access command should be performed using the low latency mode of operation (e.g., first mode of operation) or a normal mode of operation (e.g., second mode of operation). In some examples, a processor unit (e.g., a memory control unit, a memory processing unit, a graphics processing unit, a central processing unit, a general purpose graphics processing unit, a system on a chip, a field-programmable gate array, or any other type of processing unit) may direct the memory to execute an access command using the low latency mode of operation via one or more bits (e.g., a low latency enable bit) included in the command and address information, which may be provided to the memory via a command and address bus.

The control circuit may decode the command and address information to determine a value of the low latency enable bit. In response to the low latency enable bit having a first value that enables the low latency mode of operation, the control circuit may direct execution of the command (e.g., read or write) received with the command and address information to the low latency register circuit, either in parallel with or in addition to directing execution of the command to the memory array. For example, while in the low latency mode of operation based on the low latency enable bit and when the command is a read command, the control circuit may enable the low latency register circuit to compare the address received with the command and address information with addresses stored in the low latency register. If a match is detected, the low latency register circuit may provide corresponding data stored in the low latency register circuit to input/output (I/O) circuitry of the memory responsive to the read command. In examples where the address is also provided to bank logic circuitry (e.g., row and column decoder circuitry) to initiate an access of the memory array, the low latency register circuit may provide a match indication to cause the array access process to be halted or stopped if an address match is found in the low latency register circuit. If no match is found, then the memory may continue the array access process to retrieve data from the memory array based on the address. In addition to being able to provide data more quickly (e.g., with lower latency as compared with access of the memory array), the low latency register circuit configured to stop an array access before access lines and/or sense amplifiers are fired may reduce power consumption in the memory, as well as may reduce susceptibility to row hammer attacks.

While in the low latency mode of operation based on the low latency enable bit and when the command is a write command, the control circuit may provide the address and corresponding write data to the low latency register circuit for storage. In response, the low latency register circuit may store the address and write data in an available slot. In some examples, if no slots are available, the control circuit may cause the write data to be written to the memory array based on the address. The control circuit may determine whether a slot is available based on a register full indication provided from the low latency register circuit. In other examples, the control circuit may cause data to be pushed from the low latency register circuit to the memory array when the low latency register circuit provides a full indication. In some examples, if the low latency register includes previously-stored data corresponding to the received address, the previously-stored data may be marked as invalid and the new address and write data may be stored in a new slot.

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

FIG. 1 is a schematic block diagram of a semiconductor device 100, in accordance with an embodiment of the present disclosure. For example, the semiconductor device 100 may include a chip 135. The chip 135 may include a clock input circuit 105, an internal clock generator 107, an address command input circuit 115, an address decoder 120, a command decoder 125, an control circuit 121, a low latency register 122, a plurality of row decoders 130, a memory cell array 145 including sense amplifiers 150 and transfer gates 195, a plurality of column decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes), which may be selected by the column select CS signal from the column decoders 140. In some examples, each of the banks BANK0-N may include 2, 4, 8, 16, 32, etc., column planes. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YARD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, and/or a low latency enable bit to enable use of the control circuit 121 and/or the low latency register 122.

Normally, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

However, in some examples, the semiconductor device 100 may be configurable to operate in a low latency mode through use of a low latency register 122 to execute a read or write command, rather performing a memory cell array 145 access to execute the read or write command. The control circuit 121 may be configured to determine whether the semiconductor device 100 is in a low latency mode (e.g., a first mode) or a normal mode (e.g., a second mode). The low latency mode of operation may be configured to support full speed calculations of certain types of applications, such as artificial intelligence (AI) or machine learning (ML) applications. The calculations performed by these applications may be iterative, data-intensive calculations that require frequent access to newly generated data. The low latency register 122 may include registers that are capable of storing a limited subset of address and data information. Thus, to support some applications, rather than writing certain data to the memory cell array 145, the control circuit 121 may be configured to cause data to be read from or written to the low latency register 122. Operation of the low latency register 122 may be synchronous and responsive to the LCLK signal provided from the internal clock generator 107.

The control circuit 121 may determine whether an access command should be performed using the low latency mode (e.g., using the low latency register 122) or the normal mode (e.g., using the memory cell array 145). In some examples, a processor unit (e.g., a memory control unit, a memory processing unit, a graphics processing unit, a central processing unit, a general purpose graphics processing unit, a system on a chip, a field-programmable gate array, or any other type of processing unit) may direct the semiconductor device 100 to execute an access command using the low latency mode via one or more bits (e.g., a low latency enable bit) included in the command and address information, which may be provided to the semiconductor device 100 via the command and address bus 110.

The control circuit 121 may decode the command and address information to determine a value of the low latency enable bit. In response to the low latency enable bit having a first value that enables the low latency mode of operation, the control circuit 121 may direct execution of the command (e.g., read or write) received with the command and address information to the low latency register 122, either in parallel with or in addition to directing execution of the command to the memory cell array 145.

For example, while in the low latency mode of operation based on the low latency enable bit and when the command is a read command, the control circuit 121 may provide the low latency enable bit and the read command to enable the low latency register 122 to compare the address received with the command and address information (e.g., provided from the address decoder 120) with addresses stored in the low latency register 122. If a match is detected, the low latency register 122 may provide corresponding read data stored in the low latency register 122 to the IO circuit 170 responsive to the read command. In examples where the address is also provided to bank logic circuitry (e.g., the row decoders 130 and/or the column decoders 140) to initiate an access of the memory cell array 145, the low latency register 122 may provide a no match detected signal unMATCH (e.g., active low) to cause the memory cell array 145 access process to be halted or stopped if an address match is found in the low latency register 122. If no match is found, the low latency register may set the unMATCH signal, which may cause the bank logic circuitry to continue the memory cell array 145 access process to retrieve data from the memory cell array 145 based on the address. In addition to being able to provide data more quickly (e.g., with lower latency as compared with access of the memory cell array 145), the low latency register. 122 configured to stop the memory cell array 145 access before access lines (e.g., column select lines, wordlines, and/or bitlines BL and /BL) and/or sense amplifiers 150 are fired may reduce power consumption in the memory, as well as may reduce susceptibility to row hammer attacks.

While in the low latency mode of operation based on the low latency enable bit and when the command is a write command, the control circuit 121 may provide the low latency enable signal, the write command, and the write enable signal; the address decoder 120 may provide the address; and the IO circuit 170 may provide the corresponding write data to the low latency register 122 for storage. In response, the low latency register 122 may store the address and write data received from the IO circuit 170 in an available slot. In some examples, if no slots are available, the control circuit 121 may cause the write data to be written to the memory cell array 145 based on the address. The control circuit 121 may determine whether a slot is available based on a register full signal REF FULL provided from the low latency register 122. In other examples, the control circuit 121 may cause data to be pushed from the low latency register 122 to the memory cell array 145 when REG FULL signal indicates that the low latency register 122 is full. In some examples, if the low latency register 122 includes previously-stored data corresponding to the received address, the previously-stored data may be marked as invalid and the new address and write data may be stored in a new slot. The process of storing write data in the low latency register 122 is faster than storing write data in the memory cell array 145, and provides faster access to the stored write data as compared with accessing stored write data in the memory cell array 145, which may improve efficiency of certain applications.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
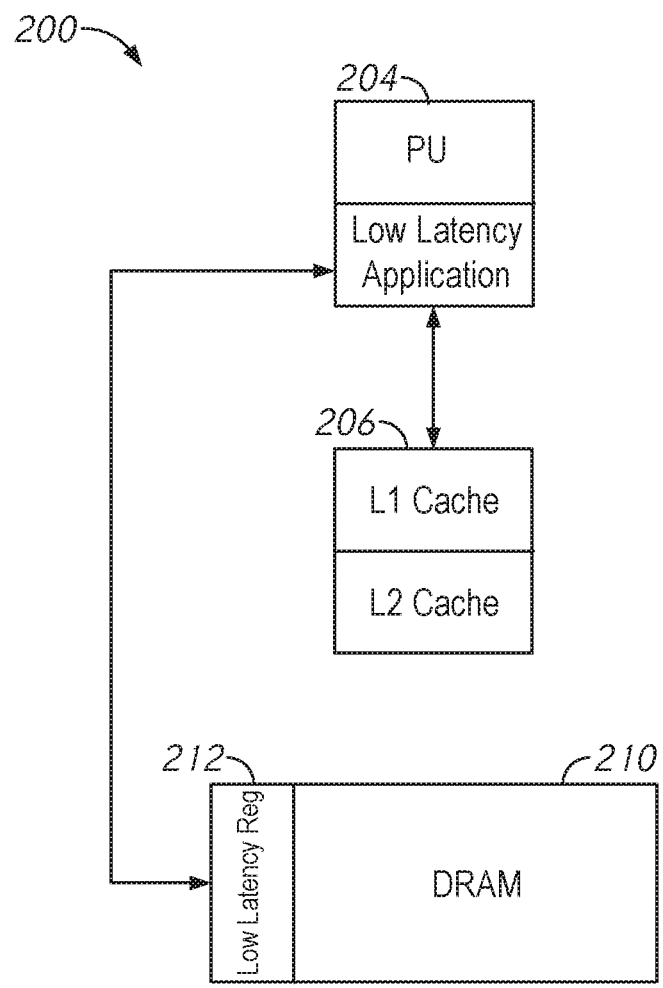
FIG. 2 is a block diagram of a computing system 200, in accordance with an embodiment of the present disclosure.

FIG. 2 is a block diagram of a computing system 200, in accordance with an embodiment of the present disclosure. The computing system 200 includes a processor unit 204 in communication with cache 206 and a DRAM 210. The DRAM 210 may include a low latency register 212 configured for use in a low latency mode.

The processor unit 204 may include any type of one or more processor units, such as a memory control unit, a memory processing unit, a graphics processing unit, a central processing unit, a general purpose graphics processing unit, a system on a chip, a field-programmable gate array, etc. The processor unit 204 may be configured to execute instructions associated with one or more applications running in the computing system. Execution of the instructions may require temporary storage of data for execution of later instructions.

The cache 206 and the DRAM 210 may facilitate the storage of data generated by the processor unit 204 during execution of instructions. The cache 206 is generally configured to provide quick (e.g., lower latency) access to frequently accessed data from the DRAM 210. The cache 206 may have a smaller size than the DRAM 210. In some examples, the cache 206 may include multiple levels, with each level varying in size and/or access latency. For example, the L1 cache of the cache 206 may have a lower capacity than the L2 cache, but may also have lower latency. The cache 206 may generally be configured to store copies of data stored at the DRAM 210. For example, the cache 206 may store data retrieved from the DRAM 210 during execution of an instruction and/or may store new data generated by the processor unit 204 during execution of an instruction, with new or updated data eventually being written to the DRAM 210. While two levels of cache are depicted in the cache 206, it is appreciated that the cache 206 may include only one level or may include three or more levels.

The DRAM 210 may have a larger capacity (e.g., by several orders of magnitude) than the cache 206, but with generally longer access latency. The DRAM 210 may include any type and/or version of DRAM, including low power DRAM, synchronous DRAM, Rambus DRAM, graphics processing DRAM, etc. Data generated by the processor unit 204 during execution of application instructions may be stored at the DRAM 210. However, while the data access operations associated with the DRAM 210 may generally be much longer than data access operations associated with the cache 206, the DRAM 210 may include a low latency register 212 that is configured to store data identified by the processor unit 204 to be low latency data. The low latency register 212 may be a smaller capacity register that is capable of storing and retrieving data more quickly than data stored to the memory array of the DRAM 210. In some examples, the processor unit 204 may direct the DRAM 210 to store low latency data at the low latency register 212 via a bit in the command and address information. The DRAM 210 may include a FIFO register, a bubble break register (e.g., a register that is capable of filling empty slots without having to wait until empty slots are shifted out an end slot), or any other type of register capable of storing addresses and data.

In operation, the processor unit 204 may execute instructions associated with one or more applications. The applications may include any type of application capable of being executed by the processor unit 204. During execution, the processor unit 204 may provide commands to write data to memory or to read data from memory. The cache 206 and/or the DRAM 210 may receive the write and read commands, and may perform access operations based on the commands, During normal operation, in response to a write command issued by the processor unit 204, the cache 206 may determine whether any block of the cache 206 has data associated with the address corresponding to the write command, and if so, may overwrite the data with the new write data. The new write data may eventually be stored at the DRAM 210. If no block of the cache 206 has data associated with the address, the cache 206 may load data associated with the address from the DRAM 210, and then overwrite the retrieved data with the new data, which will then be stored back at the DRAM 210.

In response to a read command issued by the processor unit 204, the cache 206 may determine whether any block of the cache 206 has data associated with the address corresponding to the read command, and if so, may return the data from the block. If no block of the cache 206 has data associated with the address, the cache 206 may load data associated with the address from the DRAM 210 into a block, and then may return the data.

However, in some examples, the processor unit 204 may operate in a low latency mode to communicate with the DRAM 210 directly to read and write data to the low latency register 212, rather than reading and writing data to the memory array of the DRAM 210. The processor unit 204 may indicate the low latency mode by setting a low latency enable bit included in the command and address information. The low latency mode of operation may be configured to support full speed calculations of certain types of applications, such as artificial intelligence (AI) or machine learning (ML) applications. The calculations performed by these applications may be iterative, data-intensive calculations that require frequent access to newly generated data. The low latency register 212 of the DRAM 210 may include registers that are capable of storing a limited subset of address and data information. Thus, to support some applications, rather than writing certain data to the memory array of the DRAM 210, the DRAM 210 may be configured to cause data to be read from or written to the low latency register 212.

The DRAM 210 may determine whether an access command should be performed using the low latency mode (e.g., using the low latency register 212) or the normal mode (e.g., using the memory array). A control circuit of the DRAM 210 may decode the command and address information to determine a value of the low latency enable bit. In response to the low latency enable bit having a first value that enables the low latency mode of operation, the control circuit may direct execution of the command (e.g., read or write) received with the command and address information to the low latency register 212, either in parallel with or in addition to directing execution of the command to the memory array. For example, while in the low latency mode of operation based on the low latency enable bit and when the command is a read command, the control circuit may enable the low latency register 212 to compare the address received with the command and address information with addresses stored in the low latency register 212. If a match is detected, the low latency register 212 may provide corresponding data stored in the low latency register 212 to the processor unit 204 responsive to the read command. In examples where the address is also provided to bank logic circuitry (e.g., row decoders and/or the column decoders) to initiate an access of the memory array, the low latency register 212 may provide a match signal to cause the memory array access process to be halted or stopped if an address match is found in the low latency register 212. If no match is found, then the DRAM 210 may continue the memory array access process to retrieve data from the memory array based on the address. In addition to being able to provide data more quickly (e.g., with lower latency as compared with access of the memory cell array), the low latency register 212 configured to stop the memory array access before access lines (e.g., wordlines and/or bitlines) and/or sense amplifiers are fired may reduce power consumption in the DRAM 210, as well as may reduce susceptibility to row hammer attacks.

While in the low latency mode of operation based on the low latency enable bit and when the command is a write command, the control circuit may provide the address and corresponding write data to the low latency register 212 for storage. In response, the low latency register 212 may store the address and corresponding write data in an available slot. In some examples, if no slots are available, the control circuit may cause the write data to be written to the memory array based on the address. The control circuit may determine whether a slot is available based on a register full signal provided from the low latency register 212. In other examples, the control circuit may cause data to be pushed from the low latency register 212 to the memory array when the low latency register 212 is full. In some examples, if the low latency register 212 includes previously-stored data corresponding to the received address, the previously-stored data may be marked as invalid and the new address and write data may be stored in a new slot. The process of storing write data in the low latency register 212 may be faster than storing write data in the memory array of the DRAM 210, and may provide faster access to the stored write data as compared with accessing stored write data in the memory array, which may improve efficiency of certain applications.

Figure 3A:
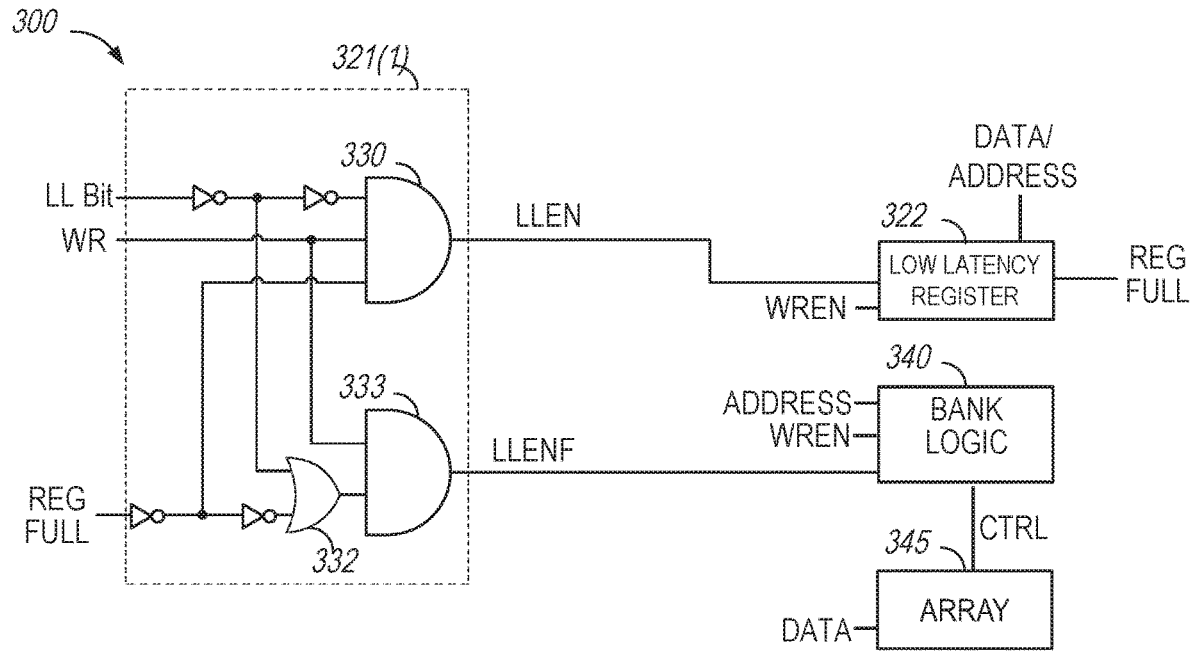
FIG. 3A is a block diagram of a logic circuitry 300 of a semiconductor device for processing a write command, in accordance with an embodiment of the present disclosure.

FIG. 3A is a block diagram of a logic circuitry 300 of a semiconductor device for processing a write command, in accordance with an embodiment of the present disclosure. The logic circuitry 300 includes a write control circuit 321(1) coupled to a low latency register 322 and a bank logic 340. The bank logic 340 is coupled to a memory array 345. The semiconductor device 100 of FIG. 1 and/or the DRAM 210 with the low latency register 212 of FIG. 2 may implement the 300, in some examples.

The write control circuit 321(1) may include a AND gate 330 and an OR gate 332 coupled to a AND gate 333, and may be configured to receive a low latency enable hit LL, a write command WR, and a register full signal REG FULL. The AND gate 330 may be configured to apply AN1) logic to provide an active high low latency enable signal LLEN to the low latency register 322 based on values of the LL bit, the WR command, and an inverted REG FULL signal (via an inverter). The OR gate 332 may be configured to apply OR logic to the REF FULL signal and an inverted LL bit (via an inverter) to provide a signal to the AND gate 333. The AND gate 333 may be configured to apply AND logic to the WR command and the output of the OR gate 332 to provide active low LL enable signal LLENF.

The low latency register 322 may be configured to receive the LLEN signal, a write enable signal WREN, and an address and data corresponding to the write command. In response to the LLEN signal having a first value and the WREN signal indicating a write is enabled, the low latency register 322 may be configured to store the address and data in a slot. If the low latency register 322 is full after storing the address and data, the low latency register 322 may update the REF FULL signal to indicate the low latency register 322 has no available slots. If a slot of the low latency register 322 includes a previously-stored address that matches the received address, the low latency register 322 may mark the previously-stored address slot as invalid when the received address is stored at the new slot. When the LLEN signal has a second value, no updates are made to the low latency register 322.

The bank logic 340 may be configured to receive the LLENF signal, the WREN signal, and the address and data corresponding to the write command. In response to the LLENF signal having a first value and the WREN signal indicating a write is enabled, the bank logic 340 may be configured to set control signals CTRL to cause the memory array 345 to perform a write access to store the received data to the memory array 345 at a location corresponding to the received address. If the LLENF signal has a second value, then the bank logic 340 prevents a write access to the memory array 345 from being performed via the CTRL signals.

Figure 3B:
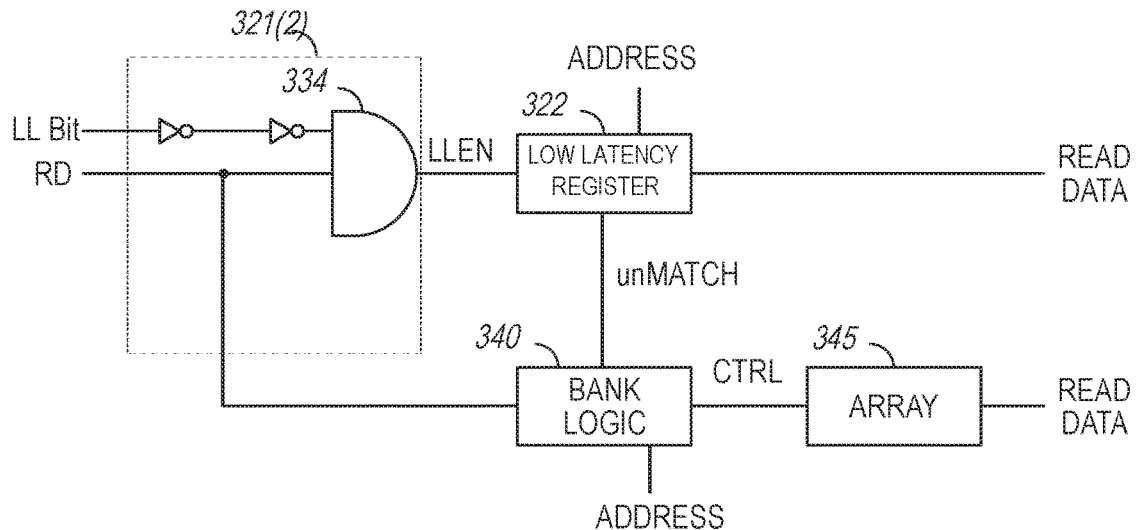
FIG. 3B is a block diagram of a logic circuitry 301 of a semiconductor device for processing a read command, in accordance with an embodiment of the present disclosure.

FIG. 3B is a block diagram of a logic circuitry 301 of a semiconductor device for processing a read command, in accordance with an embodiment of the present disclosure. The logic circuitry 301 includes a read control circuit 321(2) coupled to a low latency register 322 and a bank logic 340. The bank logic 340 is coupled to a memory array 345. The semiconductor device 100 of FIG. 1 and/or the DRAM 210 with the low latency register 212 of FIG. 2 may implement the 301, in some examples. The logic circuitry 301 may include elements that have been previously described with respect to the logic circuitry 300 of FIG. 3A. Those elements have been identified in FIG. 3B using the same reference numbers used in FIG. 3A and operation of the common elements is as previously described. Consequently, a detailed description of the operation of these particular elements will not be repeated in the interest of brevity.

The read control circuit 321(2) may include a AND gate 334, and may be configured to receive the LL bit and a read command RD. The AND gate 334 may be configured to apply AND logic to provide an active high low latency enable signal LLEN to the low latency register 322 based on values of the LL bit and the RD command. The read control circuit 321(2) may also be configured to provide the RD command to the bank logic 340.

The low latency register 322 may be configured to receive the LLEN signal and an address corresponding to the read command. In response to the LLEN signal having a first value, the low latency register 322 may be configured to search for a match between the received address and addresses stored at slots of the low latency register 322. If a match is detected, the low latency register 322 may be configured to clear an un-match signal unMATCH provided to the bank logic 340, and to provide read data from a slot corresponding to the matching address to an output. The low latency register 322 may also be configured to mark a flag associated with the matched address and data to indicate that the data has been read out, which may make the slot available to store new data. If no match is found, then the low latency register 322 may be configured to set the unMATCH signal to indicate no match is detected.

The bank logic 340 may be configured receive to the RD command, the address, and the MATCH signal. In response to the RD command, the bank logic 340 may be configured to initiate a read access of the memory array 345 based on the address. In response to the unMATCH signal being cleared, the bank logic 340 may halt or stop the read access prior to setting the CTRL signals to cause access lines and sense amplifiers to fire. If the unMATCH signal is set, the bank logic 340 may continue the read access by setting the CTRL signals to cause the memory array 345 to perform a read access to retrieve and provide read data a location of the memory array 345 corresponding to the received address.

In addition to being able to store and/or provide data more quickly (e.g., with lower latency as compared with access of the memory cell array memory array 345), the low latency register 322 of FIGS. 3A and 3B configured to stop the memory array access before access lines (e.g., wordlines and/or bitlines) and/or sense amplifiers are fired may reduce power consumption in the semiconductor device, as well as may reduce susceptibility to row hammer attacks.

Figure 4:
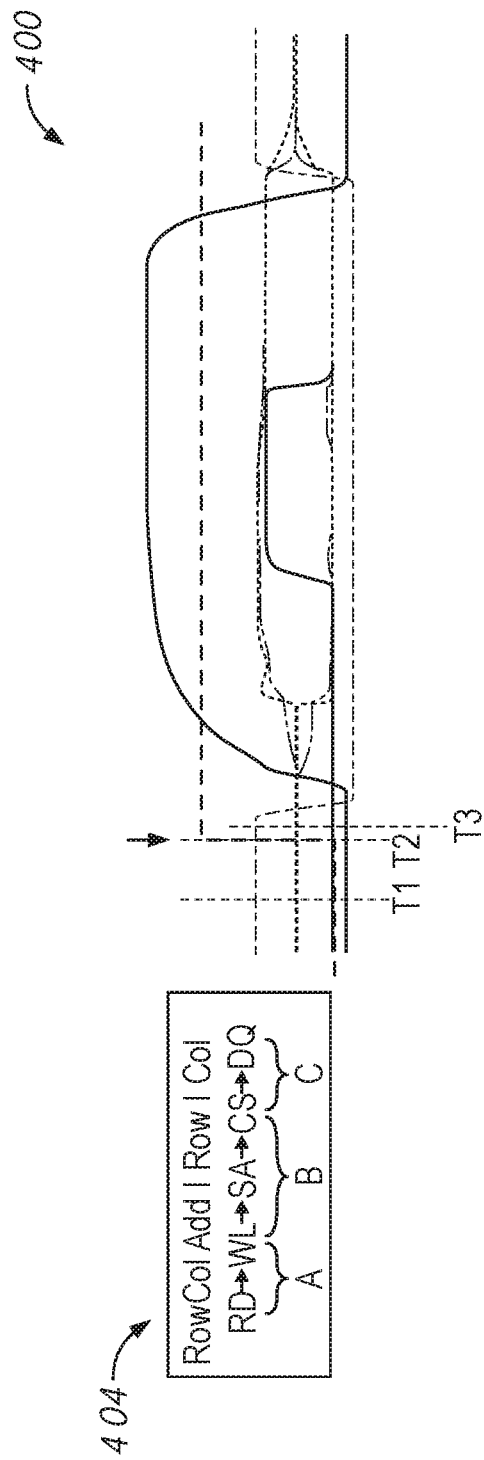
FIG. 4 includes an exemplary timing diagram 400 of a read access timing of a memory array, in accordance with embodiments of the disclosure.

FIG. 4 includes an exemplary timing diagram 400 of a read access timing of a memory array, in accordance with embodiments of the disclosure. As shown in the table 404, the sequence of a read access includes time periods A, B, and C. Time period A (e.g., receive/process read command RD) corresponds to a time between T1 and T3 of the timing diagram. Just after time T3, time period B starts (e.g., firing of wordline WD and sense amplifier SA), which is followed by time period C (e.g., firing of column select line and provision of RD data). To halt a read access, as described with reference to FIGS. 1, 2, and 3B, a low latency register (e.g., a low latency register, such as the low latency register 122 of FIG. 1, the low latency register 212 of FIG. 2, or the low latency register 322 of FIGS. 3A and 3B) may complete a comparison of a read address with stored write addresses to detect a match by time T2 to prevent firing of access lines and sense amplifiers, which start at time T3. By stopping the memory array access before the access lines and/or sense amplifiers are fired, power consumption in the semiconductor device may be reduced.

Figure 5:
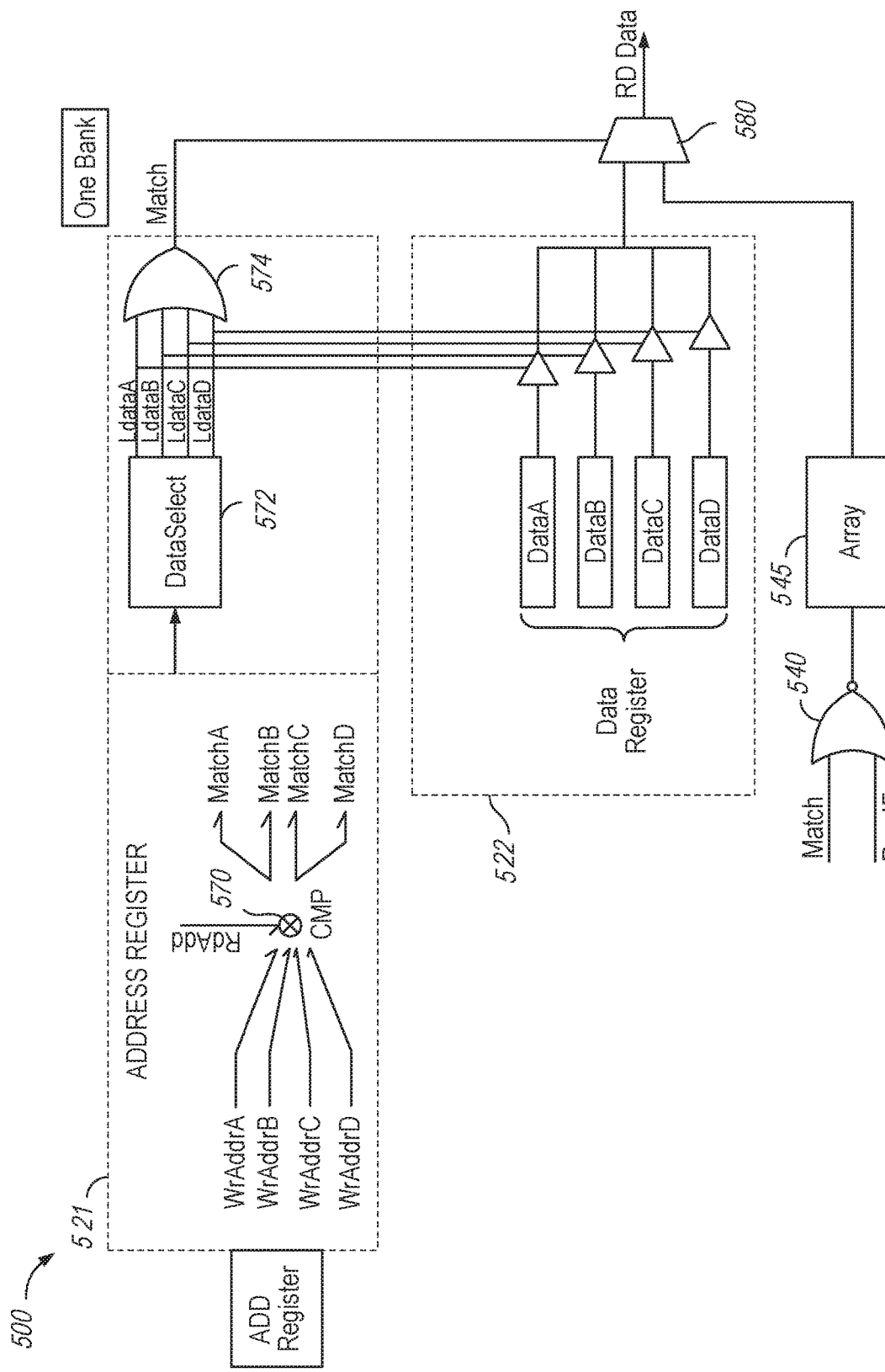
FIG. 5 is a block diagram of a low latency register 500 of a semiconductor device for processing a read command, in accordance with an embodiment of the present disclosure.

FIG. 5 is a block diagram of a low latency register 500 of a semiconductor device for processing a read command, in accordance with an embodiment of the present disclosure. The low latency register 122 of FIG. 1, the low latency register 212 of FIG. 2, and/or the low latency register 322 of FIGS. 3A and 3B may implement the low latency register 500, in some examples.

The low latency register 500 may include an address register 521 and a data register 522. The address register 521 may be configured to receive a read address RdAdd and compare the RdAdd with write addresses WrAddrA-WrAddrD stored at the address register 521 via a comparator CMP 570. In response to a match with one of the WrAddrA-WrAddrD, the address register 521 may set a corresponding match signal MatchA-MatchD.

A data selector 572 may set a data latch signal LdataA-LdataD corresponding to the MatchA-MatchD signal set when a match is detected, and an OR gate 574 may provide a match signal having a value indicating a match to a multiplexer 580 when any of the LdataA-LdataD latch signals are set.

The data register 522 may include slots DataA-DataD configured to store write data corresponding to the WrAddrA-WrAddrD. Each of the LdataA-LdataD signals may activate a respective buffer of the data register 522 corresponding to one of the data slots DataA-DataD to enable provision of data from the DataA-DataD register slot to a first input of the multiplexer 580.

A NOR gate 540 may apply NOR logic to the Match signal and an active low read signal ReadF to provide a control signal to the memory array 545. The memory array 545 may be configured to provide read data to a second input of the multiplexer 580 in response to the output of the 540. The multiplexer may provide one of an output of the data register 522 or an output of memory array 545 as read data RD Data based on a value of the Match signal. That is, if the Match signal has a first value indicating a match in the address register address register 521 and data register data register 522, the multiplexer 580 may provide the output of the data register data register 522. Otherwise, the multiplexer may provide an output of the memory array 545.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a memory array comprising a plurality of memory cells, wherein a particular one of the plurality of memory cells is configured to retain stored data based on a respective row and column address;
   a register circuit configured to store addresses and corresponding data; and
   a control circuit configured to receive, via a command and address bus, command and address information, wherein the command and address information includes the respective row and column address corresponding to the particular one of the plurality of memory cells of the memory array, wherein the control circuit is configured to selectively direct the command and address information including the respective row and column address to the memory array in response to a low latency mode being disabled and to direct the command and address information including the respective row and column address to the register circuit in response to the low latency mode being enabled.

2. The apparatus of claim 1, wherein the low latency mode is enabled via a low latency enable bit of the command and address information, wherein the control circuit is configured to determine that the low latency mode is enabled in response to the low latency enable bit having a first value and to determine that the low latency mode is disabled in response to the low latency enable bit having a second value.

3. The apparatus of claim 2, wherein, in response to the command and address information including a write command, the control circuit is configured to cause corresponding write data to be written to an available slot of the register circuit when the low latency enable bit has the first value.

4. The apparatus of claim 3, wherein, in response to the command and address information including the write command, the control circuit is configured to cause corresponding write data to be written to the memory array when the register circuit is full.

5. The apparatus of claim 4, wherein, in response to the command and address information including the write command, the control circuit is configured to determine whether the register circuit has an available slot based on a register full indicator provided by the register circuit.

6. The apparatus of claim 2, wherein, in response to the command and address information including a read command and when the low latency enable bit has the first value, the control circuit is configured to cause read data to be read from a slot of the register circuit corresponding to a slot corresponding to an address of the command and address information.

7. The apparatus of claim 6, wherein, in response to the command and address information including the read command and when the low latency enable bit has the first value, the control circuit is configured to cause a read of the memory array to stop in response to detection of stored address in the register circuit that matches the address of the command and address information.

8. The apparatus of claim 7, wherein, in response to the command and address information including the read command and when the low latency enable bit has the first value, the control circuit is configured to cause the read of the memory array to continue in response to detection of a lack of matching any stored address in the register circuit with the address of the command and address information.

9. The apparatus of claim 1, wherein, when the low latency mode is enabled, data is provided to an output via the register circuit with less latency than data is provided to the output via the memory array.

10. The apparatus of claim 1, wherein the register circuit includes a first in, first out register.

11. The apparatus of claim 1, wherein the memory array is a dynamic, random-access memory.

12. A memory comprising:
    a memory array;
    a register circuit configured to store addresses and corresponding data; and
    a control circuit configured to receive command and address data having a respective row and column address corresponding to a particular one of a plurality of memory cells of the memory array, wherein, in a first mode of operation, cause address and data to be stored at or retrieved from the register circuit based on the command and address data corresponding to the particular one of the plurality of memory cells of the memory array, wherein, in a second mode of operation, the control circuit is configured to cause data to be stored at or retrieved from the particular one of the plurality of memory cells of the memory array based on the same command and address data.

13. The memory of claim 12, wherein, data is provided from the register circuit to an output terminal with lower latency while in the first mode of operation than data is provided from the memory array to the output terminal while in the second mode of operation.

14. The memory of claim 12, wherein the control circuit is configured to determine whether in the first or second mode of operation based on a bit of the command and address information.

15. The memory of claim 12, wherein the command and address information is received from a processor unit.

16. The memory of claim 12, wherein data corresponding to the first mode of operation is related to computations of a machine learning application.

17. A method comprising:
receiving command and address information at a memory;
directing execution of the command and address information to a low latency register circuit of the memory in response to a low latency enable bit of the command and address information indicating a first mode of operation; and
directing execution of the command and address information to the memory array of the memory in response to the low latency enable bit of the command and address information indicating a second mode of operation; and
in response to the command and address information including a write command:
causing corresponding write data to be written to an available slot of the low latency register circuit when in the first mode of operation; and
causing corresponding write data to be written to the memory array when the register circuit is full.

18. The method of claim 17, wherein, in response to the command and address information including a read command and when in the first mode of operation, causing read data to be read from a slot of the low latency register circuit corresponding to a slot that matches an address of the command and address information.

19. The method of claim 18, further comprising, in response to the command and address information including the read command and when in the first mode of operation:
causing a read of the memory array to stop in response to detection of stored address in the low latency register circuit that matches the address of the command and address information; and
causing the read of the memory array to continue in response to detection of a lack of matching any stored address in the low latency register circuit with the address of the command and address information.

20. A dynamic random access memory, comprising:
a memory array comprising a plurality of volatile memory cells each configured to store corresponding data when a corresponding one of the plurality of volatile memory cells is selected responsive to a corresponding row address and a corresponding column address;
a register circuit configured to store data and row and column addresses corresponding to the data which have been provided externally; and
a control circuit configured to receive commands and row and column addresses via a command and address bus and direct the command and row and column addresses to the register circuit, wherein, in response to the commands including a write command, the control circuit is configured to direct write data to be written to the memory array when the register circuit is full.

21. The dynamic random access memory of claim 20, wherein the control circuit is configured to direct the command and row and column addresses to the register circuit while in a low latency mode and to direct the command and row and column addresses to the memory array while in a normal mode.

22. The dynamic random access memory of claim 20, wherein, in response to the commands including a write command, the control circuit is configured to direct write data to be written to an available slot of the register.

23. The dynamic random access memory of claim 20, wherein, in response to the commands including a read command, the control circuit is configured to read data from the register corresponding a row and column address.

* * * * *